United States Patent
Yang et al.

(10) Patent No.: US 10,278,257 B2
(45) Date of Patent: Apr. 30, 2019

(54) PROTECTION CIRCUIT AND LED DRIVING CIRCUIT

(71) Applicant: SHENZHEN CHINA STAR OPTOELECTRONICS TECHNOLOGY CO., LTD., Shenzhen, Guangdong (CN)

(72) Inventors: Yong Yang, Guangdong (CN); Fangyun Liu, Guangdong (CN)

(73) Assignee: SHENZHEN CHINA STAR OPTOELECTRONICS TECHNOLOGY CO., LTD., Shenzhen, Guangdong (CN)

(*) Notice: Subject to any disclaimer, the term of this patent is extended or adjusted under 35 U.S.C. 154(b) by 0 days.

(21) Appl. No.: 15/567,481

(22) PCT Filed: Mar. 17, 2017

(86) PCT No.: PCT/CN2017/077091
§ 371 (c)(1),
(2) Date: Oct. 18, 2017

(87) PCT Pub. No.: WO2018/157418
PCT Pub. Date: Sep. 7, 2018

(65) Prior Publication Data
US 2018/0295697 A1    Oct. 11, 2018

(30) Foreign Application Priority Data

Feb. 28, 2017  (CN) .......................... 2017 1 0113326

(51) Int. Cl.
*H02H 3/00*      (2006.01)
*H05B 33/08*     (2006.01)
(Continued)

(52) U.S. Cl.
CPC .......... *H05B 33/0887* (2013.01); *H02M 1/32* (2013.01); *H02M 3/156* (2013.01);
(Continued)

(58) Field of Classification Search
CPC ......... H05B 33/0884; H02H 9/02; H02H 9/04
(Continued)

(56) References Cited

U.S. PATENT DOCUMENTS

| | | | |
|---|---|---|---|
| 8,749,935 B2* | 6/2014 | Xia .................. | G01R 19/16542 320/134 |
| 2011/0006689 A1* | 1/2011 | Blanchard .......... | H05B 33/0824 315/121 |
| 2014/0168052 A1* | 6/2014 | Zhang ................ | H05B 33/0887 345/102 |

FOREIGN PATENT DOCUMENTS

| CN | 202111469 U | 1/2012 |
|---|---|---|
| CN | 103647249 A | 3/2014 |

(Continued)

*Primary Examiner* — Thuy V Tran
(74) *Attorney, Agent, or Firm* — Ladas & Parry LLP (57) ABSTRACT

A protection circuit and an LED driving circuit are provided, which include a Zener diode, a potential dividing unit, a first switch unit, and a second switch unit. The cathode and anode of the Zener diode are connected to a first power source and an input terminal of the potential dividing unit, respectively. The control terminal, input terminal, and output terminal of the first switch unit are connected to an output terminal of the potential dividing unit, a second power source, and the control terminal of the second switch unit, respectively. The input terminal and output terminal of the second switch unit are connected to the second power source and a boost circuit, respectively.

11 Claims, 6 Drawing Sheets

(51) Int. Cl.
    *H02M 1/32*     (2007.01)
    *H02M 3/158*     (2006.01)
    *H02M 3/156*     (2006.01)
    *H02H 9/04*     (2006.01)
    *H02H 9/02*     (2006.01)
    *H02M 1/00*     (2006.01)

(52) U.S. Cl.
    CPC ........ *H02M 3/158* (2013.01); *H05B 33/0815* (2013.01); *H02H 9/02* (2013.01); *H02H 9/04* (2013.01); *H02M 2001/007* (2013.01); *H05B 33/0884* (2013.01)

(58) Field of Classification Search
    USPC ...................................................... 361/88, 92
    See application file for complete search history.

(56) References Cited

FOREIGN PATENT DOCUMENTS

| | | |
|---|---|---|
| CN | 104936348 A | 9/2015 |
| CN | 204721649 U | 10/2015 |
| CN | 105960052 A | 9/2016 |

\* cited by examiner

PROTECTION CIRCUIT AND LED DRIVING CIRCUIT

TECHNICAL FIELD OF THE DISCLOSURE

The present disclosure relates to a technology of switching power supply, and more particularly, to a protection circuit and an LED driving circuit.

BACKGROUND OF THE DISCLOSURE

Figure 1:
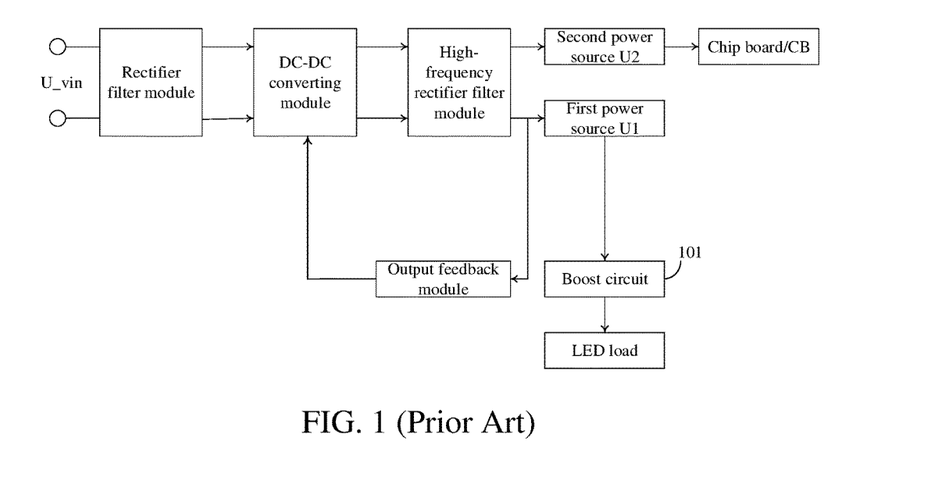
FIG. 1 is a systematic block diagram showing an LED (light emitting diode) backlight module provided in an existing skill.

FIG. 1 is a systematic block diagram showing an LED (light emitting diode) backlight module provided in an existing skill. As shown in FIG. 1, the LED backlight module includes a rectifier filter module, a DC-DC converting module, a high-frequency rectifier filter module, a boost circuit 101, an LED load, and an output feedback module. In the existing LED backlight module, an alternating current U_vin of 220V passes through the rectifier filter module, the DC-DC converting module, and the high-frequency rectifier filter module, and then is outputted as a first power source U1 and a second power source U2. Generally, the second power source U2 is used to drive a chip board/CB and the first power source U1 is used to drive the LED load.

Figure 2:
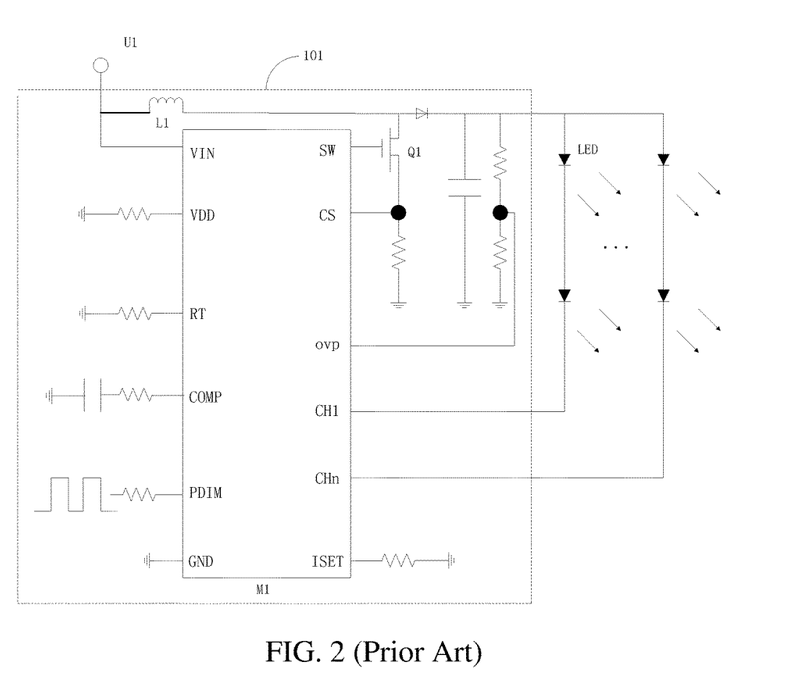
FIG. 2 is a schematic diagram showing an existing boost circuit 101 and an LED load.

Usually, the existing boost circuit is required to cooperate with an LED driving chip to drive the LED load. FIG. 2 is a schematic diagram showing the existing boost circuit 101 and the LED load. As shown in FIG. 2, the booster circuit 101 is used to pull up the first power source U1 and then supply it to the LED load. The booster circuit 101 includes an LED driving chip M1 and a switch Q1. The first power source U1 also provides a driving voltage for the LED driving chip M1. However, the range of the driving voltage is too wide such that the LED driving chip M1 works under a lower voltage. The LED driving chip M1 starts to work when the first power source U1 is low in voltage such that the current flowing through the switch Q1 is too large, causing a damage of the switch Q1 and reducing the reliability of the LED driving circuit.

Therefore, there is a need to provide a protection circuit and an LED driving circuit for solving the problems caused in the existing skills.

SUMMARY OF THE DISCLOSURE

The objective of the present disclosure is to provide a protection circuit and an LED driving circuit for improving the reliability of an existing LED backlight module.

The present disclosure provides a protection circuit, which includes:

a Zener diode, a potential dividing unit, a first switch unit, and a second switch unit;

a cathode of the Zener diode is connected to the first power source and an anode of the Zener diode is connected to an input terminal of the potential dividing unit;

the first switch unit has a control terminal connected to an output terminal of the potential dividing unit, an input terminal connected to the second power source, and an output terminal connected to a control terminal of the second switch unit, and under control of a first control signal outputted by the output terminal of the potential dividing unit, the first switch unit is configured to output a second control signal to the control terminal of the second switch unit;

the second switch unit has an input terminal connected to the second power source and an output terminal connected to the boost circuit, the second switch unit is configured to output a voltage to the boost circuit under control of the second control signal;

the boost circuit includes an LED driving chip, the output terminal of the second switch unit is connected to a start terminal of the LED driving chip, the boost circuit has an input terminal connected to the first power source for pulling up a voltage outputted by the first power source;

the potential dividing unit including a first resistor and a second resistor;

the first resistor has a first terminal connected to the anode of the Zener diode, and a second terminal connected to a first terminal of the second resistor and the control terminal of the first switch unit, the second resistor has a grounded second terminal.

In the protection circuit of the present disclosure, the first switch unit includes a third resistor, a fourth resistor, a first capacitor, and a first switch;

the third resistor has a first terminal connected to the output terminal of the potential dividing unit, and a second terminal connected to a first terminal of the first capacitor and a control terminal of the first switch, the first capacitor has a grounded second terminal;

the fourth resistor has a first terminal connected to the second power source, and a second terminal connected to a first terminal of the first switch and the control terminal of the second switch unit, the first switch has a grounded second terminal.

In the protection circuit of the present disclosure, the second switch unit includes a fifth resistor and a second switch;

the fifth resistor has a first terminal connected to the second power source, and a second terminal connected to a first terminal of the second switch and the boost circuit;

the second switch has a control terminal connected to the control terminal of the second switch unit, and a grounded second terminal.

In the protection circuit of the present disclosure, the first switch and the second switch are NPN-type transistors, and the control terminals, the first terminals, and the second terminals of the first switch and the second switch are a base, a collector, and an emitter, respectively.

In the protection circuit of the present disclosure, the first switch unit includes a third resistor, a fourth resistor, a fifth resistor, a first capacitor, and a first switch;

the third resistor has a first terminal connected to the output terminal of the potential dividing unit, and a second terminal connected to a first terminal of the first capacitor and a control terminal of the first switch, the first capacitor has a grounded second terminal;

the fourth resistor has a first terminal connected to the second power source, and a second terminal connected to a first terminal of fifth resistor and the control terminal of the second switch unit, the fifth resistor has a second terminal connected to a first terminal of the first switch, the first switch has a grounded second terminal.

In the protection circuit of the present disclosure, the second switch unit includes a second switch;

the second switch has a first terminal connected to the second power source, a control terminal connected to the first terminal of the fifth resistor, and a second terminal connected to the boost circuit.

In the protection circuit of the present disclosure, the first switch is a NPN-type transistor and the second switch is a PNP-type transistor, and the control terminal, the first terminal, and the second terminal of the first switch are a base, a collector, and an emitter, respectively, and the control terminal, the first terminal, and the second terminal of the second switch are a base, an emitter, and a collector, respectively.

The present disclosure further provides a protection circuit, which includes:

a Zener diode, a potential dividing unit, a first switch unit, and a second switch unit;

a cathode of the Zener diode is connected to the first power source and an anode of the Zener diode is connected to an input terminal of the potential dividing unit;

the first switch unit has a control terminal connected to an output terminal of the potential dividing unit, an input terminal connected to the second power source, and an output terminal connected to a control terminal of the second switch unit, and under control of a first control signal outputted by the output terminal of the potential dividing unit, the first switch unit is configured to output a second control signal to the control terminal of the second switch unit;

the second switch unit has an input terminal connected to the second power source and an output terminal connected to the boost circuit, the second switch unit is configured to output a voltage to the boost circuit under control of the second control signal.

In the protection circuit of the present disclosure, the boost circuit includes an LED driving chip, the output terminal of the second switch unit is connected to a start terminal of the LED driving chip, the boost circuit has an input terminal connected to the first power source for pulling up a voltage outputted by the first power source.

In the protection circuit of the present disclosure, the potential dividing unit includes a first resistor and a second resistor;

the first resistor has a first terminal connected to the anode of the Zener diode, and a second terminal connected to a first terminal of the second resistor and the control terminal of the first switch unit, the second resistor has a grounded second terminal.

In the protection circuit of the present disclosure, the first switch unit includes a third resistor, a fourth resistor, a first capacitor, and a first switch;

the third resistor has a first terminal connected to the output terminal of the potential dividing unit, and a second terminal connected to a first terminal of the first capacitor and a control terminal of the first switch, the first capacitor has a grounded second terminal;

the fourth resistor has a first terminal connected to the second power source, and a second terminal connected to a first terminal of the first switch and the control terminal of the second switch unit, the first switch has a grounded second terminal.

In the protection circuit of the present disclosure, the second switch unit includes a fifth resistor and a second switch;

the fifth resistor has a first terminal connected to the second power source, and a second terminal connected to a first terminal of the second switch and the boost circuit;

the second switch has a control terminal connected to the control terminal of the second switch unit, and a grounded second terminal.

In the protection circuit of the present disclosure, the first switch and the second switch are NPN-type transistors, and the control terminals, the first terminals, and the second terminals of the first switch and the second switch are a base, a collector, and an emitter, respectively.

In the protection circuit of the present disclosure, the first switch unit includes a third resistor, a fourth resistor, a fifth resistor, a first capacitor, and a first switch;

the third resistor has a first terminal connected to the output terminal of the potential dividing unit, and a second terminal connected to a first terminal of the first capacitor and a control terminal of the first switch, the first capacitor has a grounded second terminal;

the fourth resistor has a first terminal connected to the second power source, and a second terminal connected to a first terminal of fifth resistor and the control terminal of the second switch unit, the fifth resistor has a second terminal connected to a first terminal of the first switch, the first switch has a grounded second terminal.

In the protection circuit of the present disclosure, the second switch unit includes a second switch;

the second switch has a first terminal connected to the second power source, a control terminal connected to the first terminal of the fifth resistor, and a second terminal connected to the boost circuit.

In the protection circuit of the present disclosure, the first switch is a NPN-type transistor and the second switch is a PNP-type transistor, and the control terminal, the first terminal, and the second terminal of the first switch are a base, a collector, and an emitter, respectively, and the control terminal, the first terminal, and the second terminal of the second switch are a base, an emitter, and a collector, respectively.

According to above objective, the present disclosure further provides an LED driving circuit, which includes a protection circuit and a boost circuit connected to the protection circuit, the protection circuit including:

a Zener diode, a potential dividing unit, a first switch unit, and a second switch unit;

a cathode of the Zener diode is connected to the first power source and an anode of the Zener diode is connected to an input terminal of the potential dividing unit;

the first switch unit has a control terminal connected to an output terminal of the potential dividing unit, an input terminal connected to the second power source, and an output terminal connected to a control terminal of the second switch unit, and under control of a first control signal outputted by the output terminal of the potential dividing unit, the first switch unit is configured to output a second control signal to the control terminal of the second switch unit;

the second switch unit has an input terminal connected to the second power source and an output terminal connected to the boost circuit, the second switch unit is configured to output a voltage to the boost circuit under control of the second control signal.

In the LED driving circuit of the present disclosure, the boost circuit includes an LED driving chip, the output terminal of the second switch unit is connected to a start terminal of the LED driving chip, the boost circuit has an input terminal connected to the first power source for pulling up a voltage outputted by the first power source.

In the LED driving circuit of the present disclosure, the potential dividing unit includes a first resistor and a second resistor;

the first resistor has a first terminal connected to the anode of the Zener diode, and a second terminal connected to a first terminal of the second resistor and the control terminal of the first switch unit, the second resistor has a grounded second terminal.

Distinguishable from the existing skills, in the protection circuit and the LED driving circuit of the present disclosure, the present disclosure deploys a protection circuit, instead of providing a start voltage to the boost circuit directly using the first power source. Under control of the first control signal, the first switch unit of the protection circuit outputs the second control signal to the second switch unit. In this way, under control of the second control signal, the second switch unit outputs a voltage to the boost circuit. In such a manner, a voltage is outputted to the boost circuit to drive the boost circuit only when the voltage provided by the first power source is at a certain value, thereby improving the reliability of the circuit.

BRIEF DESCRIPTION OF THE DRAWINGS

The technical schemes and other beneficial effects will be more apparent with reference to the detailed descriptions of the embodiments of the present disclosure below in accompanying with the drawings.

DETAILED DESCRIPTION OF THE DISCLOSURE

For more clearly explaining the technical schemes adopted in the present disclosure and their effects, the preferred embodiments of the present disclosure are described in detail with referring to the appending drawings. Obviously, the described embodiments are merely a part of embodiments of the present disclosure and are not all of the embodiments. Based on the embodiments of the present disclosure, other embodiments obtained by those of ordinary skill in the art without making any inventive effort are within the scope the present disclosure seeks to be protected.

Figure 3:
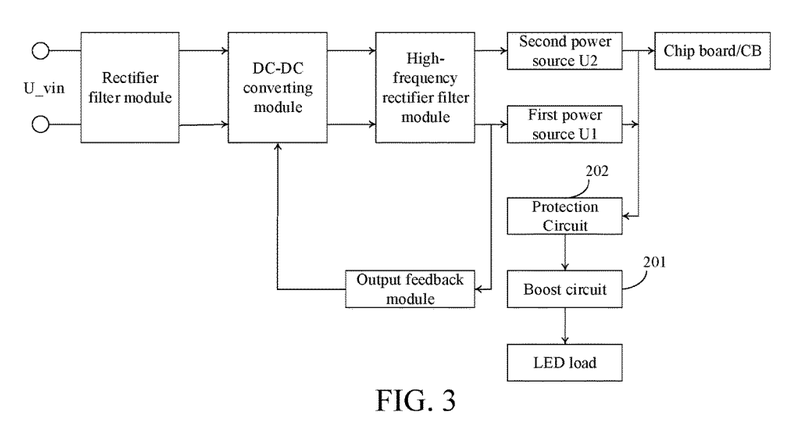
FIG. 3 is a systematic block diagram showing an LED backlight module provided in the present disclosure.

FIG. 3 is a systematic block diagram showing an LED (light emitting diode) backlight module provided in the present disclosure. As shown in FIG. 3, the LED backlight module of the present disclosure includes a rectifier filter module, a DC-DC converting module, a high-frequency rectifier filter module, a boost circuit 201, an LED load, a protection circuit 202, and an output feedback module. In the LED backlight module of the present disclosure, an alternating current U_vin of 220V passes through the rectifier filter module, the DC-DC converting module, and the high-frequency rectifier filter module, and then is outputted as a first power source U1 and a second power source U2. The second power source U2 is used to drive a chip board/CB. The first power source U1 and the second power source U2 are controlled by the protection circuit 202 to output a voltage to the boost circuit 201 to drive the LED load.

Figure 4:
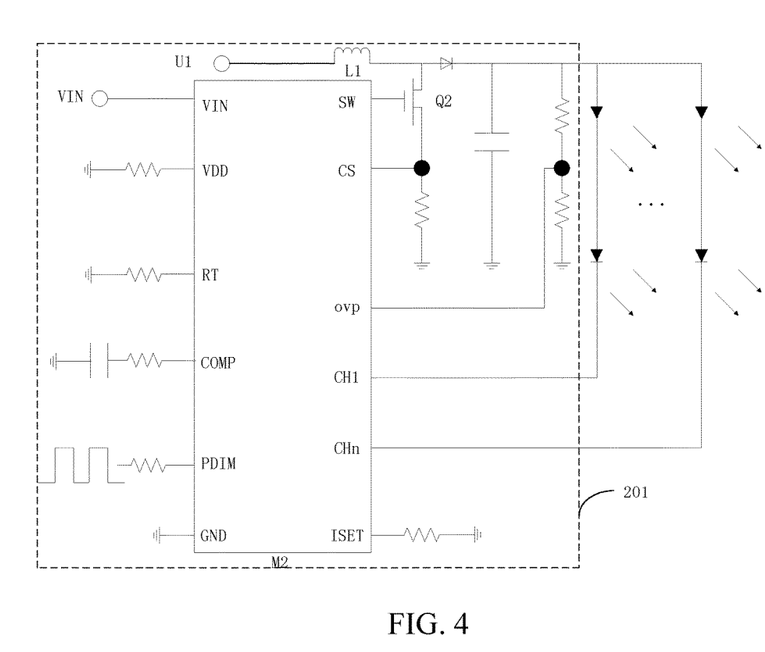
FIG. 4 is a schematic diagram showing a boost circuit 201 and an LED load in accordance with the present disclosure.

Specifically, FIG. 4 is a schematic diagram showing a boost circuit 201 and an LED load in accordance with the present disclosure. As shown in FIG. 4, the boost circuit of the present disclosure has an input terminal connected to the first power source U1. Further, the boost circuit of the present disclosure further includes an LED driving chip M2 and a switch Q2. The LED driving chip M2 has a start terminal connected to an output terminal VIN of a second switch unit. The switch Q2 has a control terminal connected to a control adjusting terminal SW of the LED driving chip M2. The switch Q2 has a first terminal receiving an output voltage of the first power source Q1 and has a second terminal connected to a feedback terminal CS of the LED driving chip M2. The LED driving chip M2 starts to work when receiving a driving voltage from the output terminal VIN of the second switch unit. The switch Q2 is controlled and adjusted using the SW terminal of the LED driving chip M2. An inductor L1 stores energy when the switch Q2 is turned on. The inductor L1 releases the stored energy when the switch Q2 is turned off. The LED load is driven by a voltage outputted from an OVP terminal of the LED driving chip M2.

Figure 5:
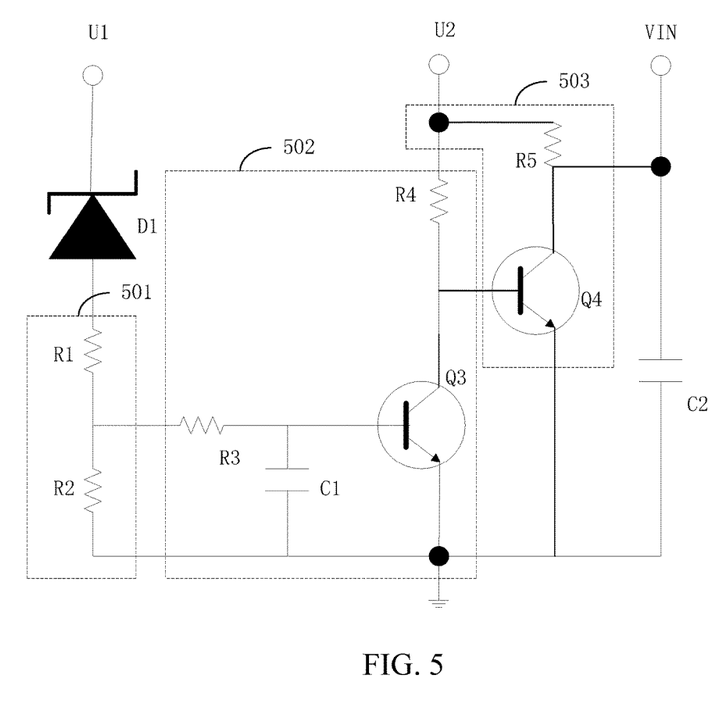
FIG. 5 is a schematic diagram showing a protection circuit in accordance with a first preferred embodiment of the present disclosure.

FIG. 5 is a schematic diagram showing a protection circuit in accordance with a first preferred embodiment of the present disclosure. As shown in FIG. 5, the protection circuit includes a Zener diode D1, a potential dividing unit 501, a first switch unit 502, and a second switch unit 503. The cathode of the Zener diode D1 is connected to the first power source U1. The anode of the Zener diode D1 is connected to an input terminal of the potential dividing unit 501.

The first switch unit 502 has a control terminal connected to an output terminal of the potential dividing unit 501. The first switch unit 502 has an input terminal connected to the second power source U2. The first switch unit 502 has an output terminal connected to a control terminal of the second switch unit 503. The first switch unit 502 is configured to output a second control signal to the control terminal of the second switch unit 503 under control of a first control signal outputted by the output terminal of the potential dividing unit 501.

The second switch unit 503 has an input terminal connected to the second power source U2 and an output terminal VIN connected to the boost circuit. The second switch unit 503 is configured to output a voltage to the boost circuit under control of the second control signal.

Specifically, the potential dividing unit 501 includes a first resistor R1 and a second resistor R2. The first resistor R1 has a first terminal connected to the anode of the Zener diode D1 and a second terminal connected to a first terminal of the second resistor R2 and the control terminal of the first switch unit 502. A second terminal of the second resistor R2 is grounded.

The first switch unit 502 includes a third resistor R3, a fourth resistor R4, a first capacitor C1, and a first switch Q3. The third resistor R3 has a first terminal connected to the output terminal of the potential dividing unit 501 and a second terminal connected to a first terminal of the first capacitor C1 and a control terminal of the first switch Q3. A second terminal of the first capacitor C1 is grounded. The fourth resistor R4 has a first terminal connected to the second power source U2 and a second terminal connected to a first terminal of the first switch Q3 and the control terminal of the second switch unit 503. A second terminal of the first switch Q3 is grounded.

The second switch unit 503 includes a fifth resistor and a second switch Q4. The fifth resistor R5 has a first terminal connected to the second power source U2 and a second terminal connected to a first terminal of the second switch Q4 and the boost circuit. The second switch Q4 has a control terminal connected to the control terminal of the second switch unit 503, and a second terminal of the second switch Q4 is grounded.

The first switch Q3 and the second switch Q4 are NPN-type transistors. The control terminals, the first terminals, and the second terminals of the first switch and the second switch are a base, a collector, and an emitter, respectively.

The protection circuit further includes a second capacitor C2, which has a first terminal connected to the output terminal VIN of the second switch unit 503 and a grounded second terminal.

The working principle of the protection circuit is described as follows. When the voltage outputted from the first power source U1 is greater than a regulated voltage value of the Zener diode D1, the Zener diode D1 is turned on and the voltage outputted from the first power source U1 is inputted to the input terminal of the potential dividing unit 501, and then the output terminal of the potential dividing unit 501 outputs the first control signal to the control terminal of the first switch unit 502. In this way, the first switch Q3 is turned on. The second power source U2 is outputted to the ground terminal via the fourth resistor R4 and the first switch Q3 such that the control terminal of the second switch unit 503 receives the second control signal. In this way, the second switch Q4 is turned off The second power source U2 outputs a voltage to the output terminal VIN of the second switch unit 503 via the input terminal of the second switch unit 503. Similarly, when the voltage outputted from the first power source U1 is smaller than the regulated voltage value of the Zener diode D1, the Zener diode D1 is turned off, the first switch Q3 is turned off, the second switch Q4 is turned on, and the second power source U2 is outputted to the ground terminal via the input terminal of the second switch unit 503. In this way, there is no voltage outputted to the output terminal VIN of the second switch unit 503.

Figure 6:
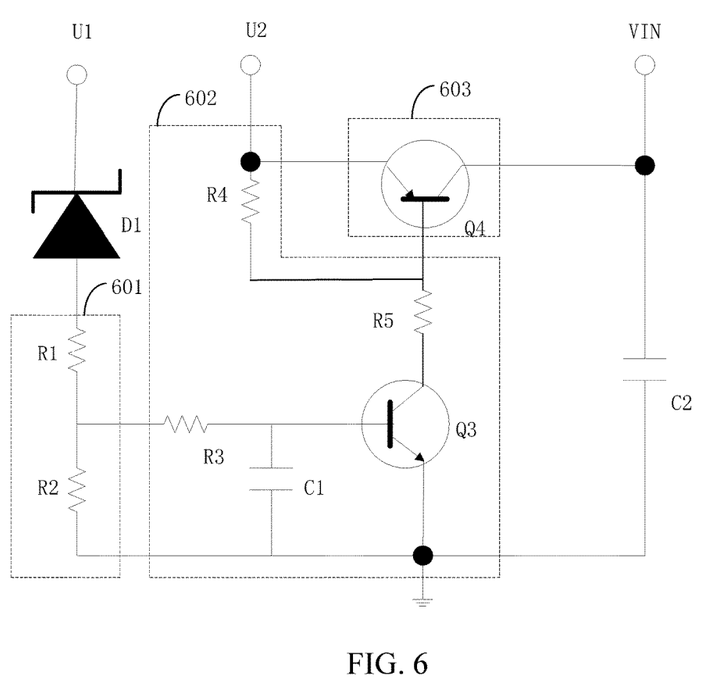
FIG. 6 is a schematic diagram showing a protection circuit in accordance with a second preferred embodiment of the present disclosure.

FIG. 6 is a schematic diagram showing a protection circuit in accordance with a second preferred embodiment of the present disclosure. As shown in FIG. 6, the protection circuit includes a Zener diode D1, a potential dividing unit 601, a first switch unit 602, and a second switch unit 603. The cathode of the Zener diode D1 is connected to the first power source U 1. The anode of the Zener diode D1 is connected to an input terminal of the potential dividing unit 601.

The first switch unit 602 has a control terminal connected to an output terminal of the potential dividing unit 601. The first switch unit 602 has an input terminal connected to the second power source U2. The first switch unit 602 has an output terminal connected to a control terminal of the second switch unit 603. The first switch unit 602 is configured to output a second control signal to the control terminal of the second switch unit 603 under control of a first control signal outputted by the output terminal of the potential dividing unit 601.

The second switch unit 603 has an input terminal connected to the second power source U2 and an output terminal VIN connected to the boost circuit. The second switch unit 603 is configured to output a voltage to the boost circuit to drive the boost circuit under control of the second control signal.

Specifically, the potential dividing unit 601 includes a first resistor R1 and a second resistor R2. The first resistor R1 has a first terminal connected to the anode of the Zener diode D1 and a second terminal connected to a first terminal of the second resistor R2 and the control terminal of the first switch unit 602. A second terminal of the second resistor R2 is grounded.

The first switch unit 602 includes a third resistor R3, a fourth resistor R4, a fifth resistor R5, a first capacitor C1, and a first switch Q3. The third resistor R3 has a first terminal connected to the output terminal of the potential dividing unit 601 and a second terminal connected to a first terminal of the first capacitor C1 and a control terminal of the first switch Q3. A second terminal of the first capacitor C1 is grounded. The fourth resistor R4 has a first terminal connected to the second power source U2 and a second terminal connected to a first terminal of fifth resistor R5 and the control terminal of the second switch unit 603. The fifth resistor R5 has a second terminal connected to a first terminal of the first switch Q3. A second terminal of the first switch Q3 is grounded.

The second switch unit 603 includes a second switch Q4. The second switch Q4 has a first terminal connected to the second power source U2, a control terminal connected to the first terminal of the fifth resistor R5, and a second terminal connected to the boost circuit.

The first switch Q3 is a NPN-type transistor and the second switch Q4 is a PNP-type transistor. The control terminal, the first terminal, and the second terminal of the first switch Q3 are a base, a collector, and an emitter, respectively. The control terminal, the first terminal, and the second terminal of the second switch Q4 are a base, an emitter, and a collector, respectively.

The protection circuit further includes a second capacitor C2, which has a first terminal connected to the output terminal VIN of the second switch unit 603 and a grounded second terminal.

The working principle of the protection circuit is described as follows. When the voltage outputted from the first power source U1 is greater than a regulated voltage value of the Zener diode D1, the Zener diode D1 is turned on and the voltage outputted from the first power source U1 is inputted to the input terminal of the potential dividing unit 601, and then the output terminal of the potential dividing unit 601 outputs the first control signal to the control terminal of the first switch unit 602. In this way, the first switch Q3 is turned on. The second power source U2 is outputted to the ground terminal via the fourth resistor R4, the fifth resistor R5, and the first switch Q3 such that the control terminal of the second switch unit 603 receives the second control signal. In this way, the second switch Q4 is turned on. The second power source U2 outputs a voltage to the output terminal VIN of the second switch unit 603 via the input terminal of the second switch unit 603. Similarly, when the voltage outputted from the first power source U1 is smaller than the regulated voltage value of the Zener diode DE the Zener diode D1 is turned off, the first switch Q3 is turned off, the second switch Q4 is turned off. In this way, there is no voltage outputted to the output terminal VIN of the second switch unit 603.

In the present disclosure, by use of the protection circuit and the control of the first switch and the second switch, a voltage is outputted to the LED driving chip only when the voltage provided by the first power source is at a certain value, thereby improving the reliability of the circuit.

The present disclosure further provides an LED driving circuit including the protection circuit described in above embodiments. The protection circuit has been described detailedly in above embodiments, and is not repeated herein.

In the LED driving circuit of the present disclosure, by use of the protection circuit and the control of the first switch and the second switch, a voltage is outputted to the LED driving circuit only when the voltage provided by the first power source is at a certain value, thereby improving the reliability of the circuit.

While the preferred embodiments of the present disclosure have been illustrated and described in detail, various modifications and alterations can be made by persons skilled in this art. The embodiment of the present disclosure is therefore described in an illustrative but not restrictive sense. It is intended that the present disclosure should not be limited to the particular forms as illustrated, and that all modifications and alterations which maintain the spirit and realm of the present disclosure are within the scope as defined in the appended claims.

What is claimed is:

1. A protection circuit, comprising:
a Zener diode, a potential dividing unit, a first switch unit, and a second switch unit;
a cathode of the Zener diode is connected to a first power source and an anode of the Zener diode is connected to an input terminal of the potential dividing unit;
the first switch unit has a control terminal connected to an output terminal of the potential dividing unit, an input terminal connected to a second power source, and an output terminal connected to a control terminal of the second switch unit, and under control of a first control signal outputted by the output terminal of the potential dividing unit, the first switch unit is configured to output a second control signal to the control terminal of the second switch unit;
the second switch unit has an input terminal connected to the second power source and an output terminal connected to a boost circuit, the second switch unit is configured to output a voltage to the boost circuit under control of the second control signal;
wherein the first switch unit comprises a third resistor, a fourth resistor, a first capacitor, and a first switch; the third resistor has a first terminal connected to the output terminal of the potential dividing unit, and a second terminal connected to a first terminal of the first capacitor and a control terminal of the first switch, the first capacitor has a grounded second terminal; the fourth resistor has a first terminal connected to the second power source, and a second terminal connected to a first terminal of the first switch and the control terminal of the second switch unit, the first switch has a grounded second terminal, and
wherein the second switch unit comprises a fifth resistor and a second switch; the fifth resistor has a first terminal connected to the second power source, and a second terminal connected to a first terminal of the second switch and the boost circuit; the second switch has a control terminal connected to the control terminal of the second switch unit, and a grounded second terminal.

2. The protection circuit according to claim 1, wherein the first switch and the second switch are NPN-type transistors, and the control terminal, the first terminal, and the second grounded terminal of the first switch and those of the second switch include a base, a collector, and an emitter, respectively.

3. The protection circuit according to claim 1, wherein the boost circuit comprises an LED driving chip, the output terminal of the second switch unit is connected to a start terminal of the LED driving chip, the boost circuit has an input terminal connected to the first power source for pulling up a voltage outputted by the first power source.

4. The protection circuit according to claim 1, wherein the potential dividing unit comprises a first resistor and a second resistor;
the first resistor has a first terminal connected to the anode of the Zener diode, and a second terminal connected to a first terminal of the second resistor and the control terminal of the first switch unit, the second resistor has a grounded second terminal.

5. A protection circuit, comprising:
a Zener diode, a potential dividing unit, a first switch unit, and a second switch unit;
a cathode of the Zener diode is connected to a first power source and an anode of the Zener diode is connected to an input terminal of the potential dividing unit;
the first switch unit has a control terminal connected to an output terminal of the potential dividing unit, an input terminal connected to a second power source, and an output terminal connected to a control terminal of the second switch unit, and under control of a first control signal outputted by the output terminal of the potential dividing unit, the first switch unit is configured to output a second control signal to the control terminal of the second switch unit;
the second switch unit has an input terminal connected to the second power source and an output terminal connected to a boost circuit, the second switch unit is configured to output a voltage to the boost circuit under control of the second control signal,
wherein the first switch unit comprises a third resistor, a fourth resistor, a fifth resistor, a first capacitor, and a first switch; the third resistor has a first terminal connected to the output terminal of the potential dividing unit, and a second terminal connected to a first terminal of the first capacitor and a control terminal of the first switch, the first capacitor has a grounded second terminal; the fourth resistor has a first terminal connected to the second power source, and a second terminal connected to a first terminal of the fifth resistor and the control terminal of the second switch unit, the fifth resistor has a second terminal connected to a first terminal of the first switch, the first switch has a grounded second terminal, and
the second switch unit comprises a second switch; the second switch has a first terminal connected to the second power source, a control terminal connected to the first terminal of the fifth resistor, and a second terminal connected to the boost circuit.

6. The protection circuit according to claim 5, wherein the boost circuit comprises an LED driving chip, the output terminal of the second switch unit is connected to a start terminal of the LED driving chip, the boost circuit has an input terminal connected to the first power source for pulling up a voltage outputted by the first power source.

7. The protection circuit according to claim 5, wherein the potential dividing unit comprises a first resistor and a second resistor;
the first resistor has a first terminal connected to the anode of the Zener diode, and a second terminal connected to a first terminal of the second resistor and the control terminal of the first switch unit, the second resistor has a grounded second terminal.

8. The protection circuit according to claim 5, wherein the first switch is a NPN-type transistor and the second switch is a PNP-type transistor, and the control terminal, the first terminal, and the second terminal of the first switch include a base, a collector, and an emitter, respectively, and the control terminal, the first terminal, and the second terminal of the second switch include a base, an emitter, and a collector, respectively.

9. An LED driving circuit, which comprises a protection circuit and a boost circuit connected to the protection circuit, the protection circuit comprising:
 a Zener diode, a potential dividing unit, a first switch unit, and a second switch unit;
 a cathode of the Zener diode is connected to a first power source and an anode of the Zener diode is connected to an input terminal of the potential dividing unit;
 the first switch unit has a control terminal connected to an output terminal of the potential dividing unit, an input terminal connected to a second power source, and an output terminal connected to a control terminal of the second switch unit, and under control of a first control signal outputted by the output terminal of the potential dividing unit, the first switch unit is configured to output a second control signal to the control terminal of the second switch unit;
 the second switch unit has an input terminal connected to the second power source and an output terminal connected to the boost circuit, the second switch unit is configured to output a voltage to the boost circuit under control of the second control signal,
 wherein the first switch unit comprises a third resistor, a fourth resistor, a first capacitor, and a first switch; the third resistor has a first terminal connected to the output terminal of the potential dividing unit, and a second terminal connected to a first terminal of the first capacitor and a control terminal of the first switch, the first capacitor has a grounded second terminal; the fourth resistor has a first terminal connected to the second power source, and a second terminal connected to a first terminal of the first switch and the control terminal of the second switch unit, the first switch has a grounded second terminal, and
 wherein the second switch unit comprises a fifth resistor and a second switch; the fifth resistor has a first terminal connected to the second power source, and a second terminal connected to a first terminal of the second switch and the boost circuit; the second switch has a control terminal connected to the control terminal of the second switch unit, and a grounded second terminal.

10. The LED driving circuit according to claim 9, wherein the boost circuit comprises an LED driving chip, the output terminal of the second switch unit is connected to a start terminal of the LED driving chip, the boost circuit has an input terminal connected to the first power source for pulling up a voltage outputted by the first power source.

11. The LED driving circuit according to claim 9, wherein the potential dividing unit comprises a first resistor and a second resistor;
 the first resistor has a first terminal connected to the anode of the Zener diode, and a second terminal connected to a first terminal of the second resistor and the control terminal of the first switch unit, the second resistor has a grounded second terminal.

\* \* \* \* \*